United States Patent
Pelleriti

(10) Patent No.: US 7,332,963 B2
(45) Date of Patent: Feb. 19, 2008

(54) LOW NOISE AMPLIFIER

(75) Inventor: Roberto Pelleriti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 212 days.

(21) Appl. No.: 11/213,440

(22) Filed: Aug. 25, 2005

(65) Prior Publication Data
US 2006/0044064 A1   Mar. 2, 2006

(30) Foreign Application Priority Data
Aug. 26, 2004  (EP) ................................. 04425635

(51) Int. Cl.
H03F 3/45 (2006.01)
H03F 1/36 (2006.01)

(52) U.S. Cl. ......................... 330/254; 330/86
(58) Field of Classification Search ................... 330/86
See application file for complete search history.

(56) References Cited

U.S. PATENT DOCUMENTS

| | | | | | |
|---|---|---|---|---|---|
| 4,267,518 | A | * | 5/1981 | Davis | 330/254 |
| 4,340,866 | A | * | 7/1982 | Metz | 330/254 |
| 4,646,029 | A | * | 2/1987 | Kamata et al. | 330/283 |
| 4,864,248 | A | * | 9/1989 | Jansen | 330/254 |
| 5,955,921 | A | * | 9/1999 | Ide et al. | 330/254 |
| 5,977,828 | A | * | 11/1999 | Hu et al. | 330/254 |
| 6,072,366 | A | * | 6/2000 | Maeda et al. | 330/254 |
| 6,445,248 | B1 | * | 9/2002 | Gilbert | 330/51 |
| 6,545,534 | B1 | * | 4/2003 | Mehr | 330/69 |
| 6,559,717 | B1 | | 5/2003 | Lynn et al. | 330/133 |
| 6,684,065 | B2 | * | 1/2004 | Bult et al. | 455/252.1 |
| 6,771,124 | B1 | * | 8/2004 | Ezell | 330/129 |
| 6,842,071 | B1 | * | 1/2005 | Retz et al. | 330/133 |
| 6,958,653 | B2 | * | 10/2005 | Vaara et al. | 330/256 |
| 7,015,758 | B2 | * | 3/2006 | Morohashi et al. | 330/278 |
| 7,023,275 | B2 | * | 4/2006 | Miyamoto | 330/254 |
| 7,034,606 | B2 | * | 4/2006 | Caresosa et al. | 327/563 |
| 7,076,226 | B2 | * | 7/2006 | Bult et al. | 455/252.1 |
| 7,132,888 | B2 | * | 11/2006 | Behzad | 330/254 |
| 7,202,741 | B2 | * | 4/2007 | Park et al. | 330/254 |
| 7,215,196 | B2 | * | 5/2007 | Banba et al. | 330/254 |
| 2002/0093380 | A1 | | 7/2002 | Cali | 330/254 |

OTHER PUBLICATIONS

European Search Report dated Feb. 16, 2005 for European Application No. 04425635.

* cited by examiner

*Primary Examiner*—Robert Pascal
*Assistant Examiner*—Krista M Flanagan
(74) *Attorney, Agent, or Firm*—Lisa K. Jorgenson; Stephen Bongini; Fleit Kain Gibbons Gutman Bongini & Bianco, P.L.

(57) ABSTRACT

A low noise amplifier is provided that includes a first circuit block capable of amplifying a first voltage signal that is input to the amplifier. The first circuit block includes a first terminal coupled to a first supply voltage by a variable resistance, and a second terminal coupled to a second supply voltage. The second terminal is coupled to an output terminal of the amplifier, and the first voltage signal is applied to a further terminal of the first circuit block. The amplifier also includes a feedback network coupled to the output terminal and to the further terminal of the first circuit block, and a second circuit block coupled between the second supply voltage and the further terminal of the first circuit block. The second circuit block is adapted to compensate for variations in value of the variable resistance to ensure a substantially constant input resistance of the amplifier.

21 Claims, 6 Drawing Sheets

LOW NOISE AMPLIFIER

CROSS-REFERENCE TO RELATED APPLICATIONS

This application is based upon and claims priority from prior European Patent Application No. 04425635.2, filed Aug. 26, 2004, the entire disclosure of which is herein incorporated by reference.

FIELD OF THE INVENTION

The present invention relates to low noise amplifiers.

BACKGROUND OF THE INVENTION

It is generally known that in urban areas where the transmission and reception via satellite of audio signals is limited or not available, land repeaters have to be used in the systems of transmission and reception of audio signals so as to guarantee maximum reliability. For this reason, amplifiers of audio signals used in the systems of transmission and reception must be capable of using audio signals with a wide volume range, from −90 dBm to 0 dBm, without any degradation of the signal/noise S/(N+I) ratio, where S indicates the power of the input signal, N indicates the noise and I indicates the interference.

To avoid the saturation of the cascade stages in the case of multistage amplifiers, the amplifiers must be capable of reducing the gain when the power of the input signal increases. To keep a good signal/noise ratio the amplifier must present a low noise pattern when the input signal is very low and a good linearity when the input signal is very high, keeping a good input coupling to avoid problems due to the standing waves.

A low noise amplifier of this type is described in U.S. Pat. No. 6,600,371. The amplifier comprises a first circuit block capable of converting into current a first voltage signal that is input to the amplifier, and a second circuit block adapted to divide the current coming from the first block. The second block is controlled by a second voltage signal and the first and second circuit blocks provide a variable voltage gain to the amplifier. The amplifier also comprises first and second resistors and a feedback network; the first resistor is connected to a first output terminal of the second block and to a supply voltage, and the second resistor is connected between the first output terminal of the second block and a second output terminal of the second block. The feedback network is coupled to the first terminal and to the first circuit block, and the second terminal is coupled to at least one output terminal of the low noise amplifier. The low noise amplifier permits good input coupling to be obtained, but nevertheless does not assist in an increase in the linearity when the gain decreases. In addition there is a limited reduction of the gain due to the ratio between the resistors.

Another circuit structure for a low noise amplifier provides, in addition to the circuitry of the amplifier previously described, a transistor that is coupled with the first circuit block, constituted by bipolar transistors, to modulate the emitter degeneration resistor so as to reduce the gain. With a circuit structure of this kind there is an increase in the input linearity when the gain is reduced but the input coupling is lost.

SUMMARY OF THE INVENTION

It is an object of the present invention to provide a low noise amplifier that overcomes the above-mentioned drawbacks.

Another object of the present invention is to provide a low noise amplifier that presents a constant input resistance, good linearity characteristics in the case of high input signals and a good noise pattern in the case of low input signals.

One embodiment of the present invention provides a low noise amplifier that includes at least one first circuit block capable of amplifying a first voltage signal that is input to the amplifier, a feedback network, and at least one second circuit block. The first circuit block has at least one first terminal coupled to a first supply voltage by a first variable resistance, and at least one second terminal coupled to a second supply voltage by at least one resistor. The at least one second terminal is coupled to at least one output terminal of the amplifier, and the first voltage signal is applied to at least one further terminal of the first circuit block. The feedback network is coupled to the at least one output terminal of the amplifier and to the at least one further terminal of the first circuit block. The second circuit block is coupled between the second supply voltage and the at least one further terminal of the first circuit block, and is adapted to compensate for variations in value of the first variable resistance to ensure a substantially constant input resistance of the amplifier.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
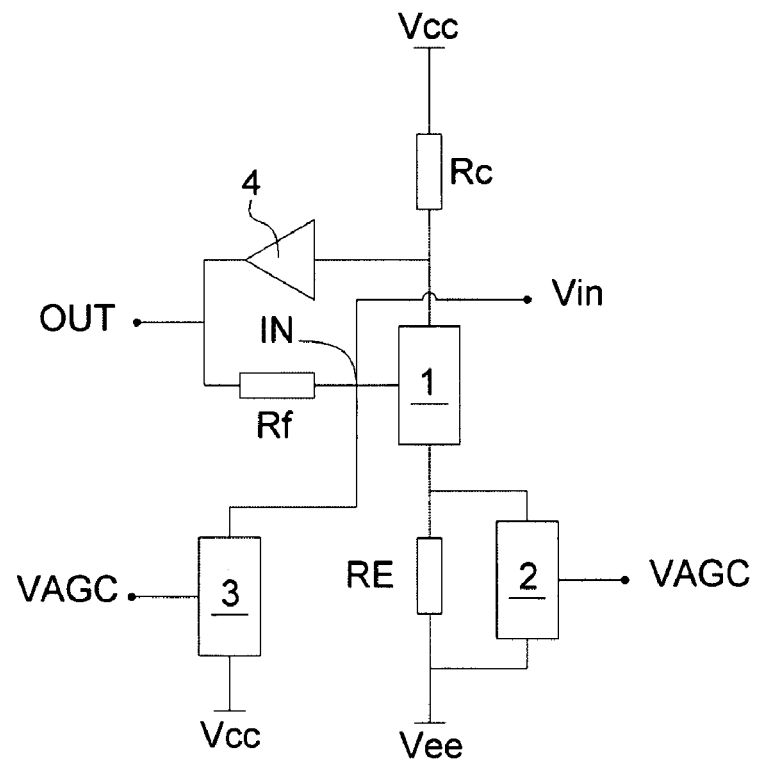
FIG. 1 is a block diagram of a low noise amplifier in accordance with a preferred embodiment of the present invention.

FIG. 1 shows a diagram of a low noise amplifier in accordance with a preferred embodiment of the present invention. As shown, the low noise amplifier comprises at least one first circuit block 1 capable of converting to current a first voltage signal Vin that is input to the amplifier. The first circuit block 1, which preferably is constituted by a bipolar or MOS transistor, has a first terminal, the emitter terminal in the case of a bipolar npn transistor, coupled to a first supply voltage Vee by a first resistor RE, and a second terminal, the collector terminal in the case of a bipolar npn transistor, coupled to a second supply voltage Vcc by a second resistor Rc. The second terminal is coupled to the output terminal of the amplifier by a buffer 4, and the first circuit block 1 is adapted to amplify the first voltage signal Vin that is applied to a further terminal IN, the base terminal in the case of a bipolar npn transistor, of the first circuit block 1. The amplifier also comprises a further resistor RF that is coupled to the output terminal OUT and to the further terminal IN of the first circuit block 1, and first circuit means 2 controlled by a second voltage signal VAGC and adapted to form with the first resistor RE a variable resistor circuit block. The amplifier further comprises second circuit means 3 placed between the second supply voltage Vcc and the further terminal IN of the first circuit block 1. The second circuit means 3 is controlled by the second voltage signal VAGC and is adapted to compensate for the value variations of the above-mentioned variable resistor circuit block RE and 2 to ensure a substantially constant input resistance $R_{in}$ of the amplifier.

Figure 2:
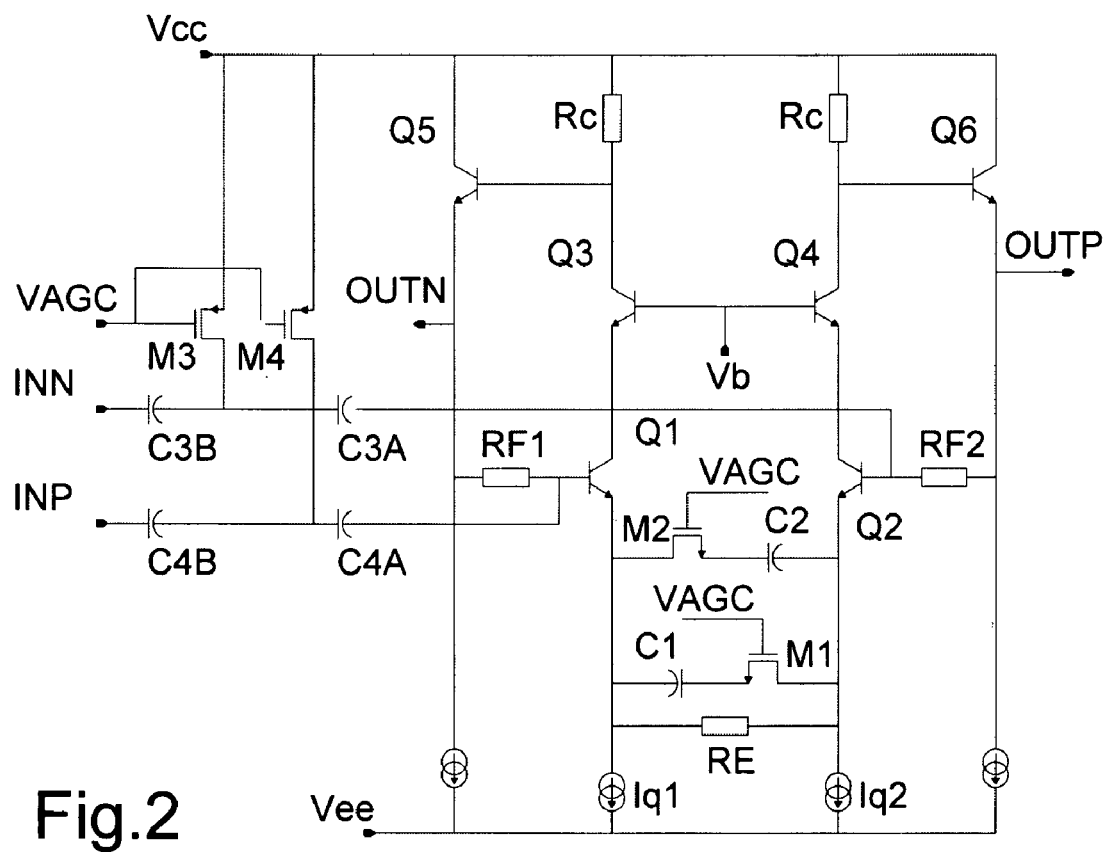
FIG. 2 is a circuit diagram of an implementation of a low noise amplifier according to a first embodiment of the present invention.

An implementation of a low noise amplifier according to a first embodiment of the present invention is shown in FIG. 2. The first circuit block 1 comprises a differential cascode apparatus formed by the bipolar npn transistors Q1-Q4. The transistors Q1 and Q3 and the transistors Q2 and Q4 have the respective collector and emitter terminals in common. The emitter terminals of the transistors Q1 and Q2 are connected to the leads of the resistor RE and are connected to respective current generators Iq1 and Iq2, while the collector terminals of the transistors Q3 and Q4 are connected to respective resistors Rc that are connected to the supply Vcc. The base terminals of the transistors Q3 are Q4 are connected to a bias voltage generator Vb. The first circuit means 2 are made up of a first series of an NMOS transistor M1 and a capacitor C1 and a second series of an NMOS transistor M2 and a capacitor C2 that are placed between the emitter terminals of the transistors Q1 and Q2; the transistors M1 and M2 are controlled by the voltage VAGC. The transistors M1 and M2 are used to change the value of the degeneration resistor connected to the emitter terminals of the transistors Q1 and Q2 by a value 0 (with VAGC=Vcc and M1 and M2 short-circuited) to a value RE (with VAGC=0 and M1 and M2 open). The capacitors C1 and C2 are used to keep the transistors M1 and M2 in the triode region in the conditions in which the voltage VAGC is between the values 0 and Vcc.

The amplifier also comprises two bipolar npn transistors Q5 and Q6 whose base terminals are connected to the collector terminals of the transistors Q3 and Q4, whose collector terminals are connected to the supply voltage Vcc and whose emitter terminals, which constitute the outputs OUTP and OUTN of the amplifier, are connected to the base terminals of the transistors Q1 and Q2 through two resistors RF1 and RF2 of value equal to a resistor RF and are connected to bias current generators.

The second circuit means 3 comprise a series of a PMOS transistor M3 and a capacitor C3A connected between the supply voltage Vcc and the base terminal of the transistor Q2, and another series of a PMOS transistor M4 and a capacitor C4A connected between the supply voltage Vcc and the base terminal of the transistor Q1. Two other capacitors C3B and C4B are placed between the input terminals INP and INN of the amplifier and the drain terminals of the transistors M3 and M4, respectively. The input voltage Vin given by V(INP)-V(INN) is present on the input terminals INP and INN. The transistors M3 and M4 are used to change the input impedance when the gain of the amplifier decreases, while the capacitors are used for decoupling from the direct current and also to keep the transistors M3 and M4 in the triode region with the voltage Vds between the drain terminals and source equal to zero for all the values of voltage VAGC.

The input resistor is given by:

$$R_{in} \approx R_{in1} // R_{in2} = \left( \frac{2}{k_p \left(\frac{W}{L}\right)_{3,4} |V_{GS3,4} - V_{T,p}|} \right) // \frac{2R_F}{A_{V,loop}}$$

where the parameter $k_p$ depends on the mobility of the charges and on the capacity of the layer of gate oxide of the PMOS transistors M3 and M4, the parameter $(W/L)_{3,4}$ is the form ratio of the transistors M3 and M4, the voltage $V_{GS3,4}$ is the voltage between the gate and source terminals of the transistors M3 and M4, the voltage $V_T$ is the thermal voltage of the PMOS transistors, $$A_{V,loop} = Gm_{eq} \cdot R_C = \frac{g_{m1,2}}{1 + g_{m1,2} \cdot R_{E,eq}} R_C$$

and $$R_{E,eq} = RE // \left( \frac{1}{2 \cdot k_n \cdot \left(\frac{W}{L}\right)_{1,2} (V_{GS,n} - V_T)} \right)$$

in which $g_{m1,2}$ is the transconductance of the couple of transistors Q1 and Q2, the parameter $k_n$ depends on the mobility of the charges and on the capacity of the layer of gate oxide of the transistors M1 and M2, the voltage $V_{GS,n}$ is the voltage between the gate and source terminals of the transistors M1 and M2 and the voltage $V_T$ is the thermal voltage of the NMOS transistors M1 and M2. To obtain the coupling of the input resistor $R_{in}$, it is necessary to make it equal to the differential source resistance, that is the source resistance of the input signal Vin.

In conditions of maximum gain, that is when VAGC=Vcc, the amplifier is based on the differential cascode stage, Q1-Q4, and on the followers Q5 and Q6. The resistors RF1 and RF2 produce a feedback parallel-parallel configuration. In this manner the input impedance is well controlled and a low noise pattern is obtained.

The voltage gain $A_{V, loop}$ in the case of maximum gain $A_{Vmax}$, that is placing VAGC=Vcc is:

$$A_{V\max} = \left.\frac{V(OUTP) - V(OUTN)}{V(INP) - V(INN)}\right|_{VAGC=Vcc} = g_{m1,2} \cdot R_C$$

and the input resistance in this case is:

$$R_{in} \approx \frac{2R_F}{A_{V,loop}} \frac{2 \cdot R_F}{g_{m1,2} \cdot R_C}.$$

Thanks to the stable bias current in the transistors Q1 and Q2, the gain $A_v$ is given by the ratio between the resistors made in polysilicon and the emitter areas. This means that in the maximum gain configuration the tolerance on the input impedance is approximately +/−20%, that permits return losses higher than −15 dB to be obtained.

Leaving aside several minimum contributions in high frequency, the noise pattern F is:

$$F = \left[1 + \frac{r_{b1,2} + r_{e1,2}}{R_S} + \frac{R_S}{R_F} + \frac{1}{2}\left(\frac{1}{g_{m1,2}R_S} + \frac{g_{m1,2}R_S}{\beta_F}\right)\right]$$

where the resistance $r_{b1,2}$ is the base resistance of the transistors Q1 and Q2, the resistance $R_S$ is the source resistance, and the parameter $\beta_F$ is the current gain of the transistors Q1 and Q2. The input linearity is given by $2V_T$.

In the configuration with minimum voltage gain, $A_{V, loop}$ indicated by $A_{Vmin}$, in the configuration in which VAGC=0V, the emitter resistance is at the maximum value; it results:

$$A_{V\min} = \left.\frac{V(OUTP) - V(OUTN)}{V(INP) - V(INN)}\right|_{VAGC=0V} = 2 \cdot \frac{R_C}{R_E}$$

while the input linearity is $R_E I_{E1,2}$.

Considering the input coupling, in the conditions the feedback is disabled and the input impedance is fixed by the PMOS transistors M3 and M4 in the triode region, connected in parallel to the input. It results:

$$R_{in} \approx \left(\frac{2}{k_p\left(\frac{W}{L}\right)_{3,4}|V_{GS3,4} - V_{T,p}|}\right)$$

Selecting appropriately the ratio (W/L) of the transistors M3 and M4 it is possible to keep good return losses and a minimum gain. With the amplifier at minimum gain a tolerance of 30% on the input resistance can be obtained, that permits return losses of −15 dB to be obtained.

Figure 3:
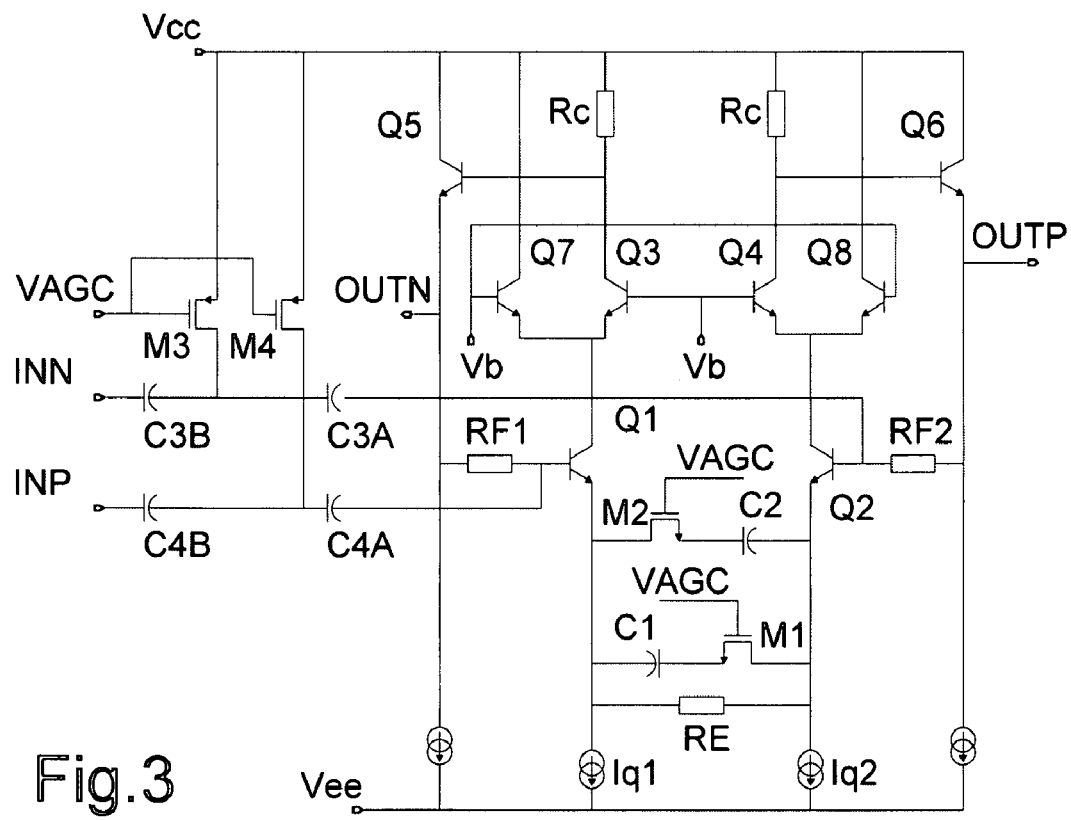
FIG. 3 is a circuit diagram of an implementation of a low noise amplifier according to a variant of the first embodiment of the present invention.

Another implementation of an amplifier according to a variant of the first embodiment of the present invention is shown in FIG. 3. The amplifier of FIG. 3 differs from the amplifier of FIG. 2 in the presence of two other bipolar npn transistors Q7 and Q8 that have their emitter terminals connected to the transistors Q3 and Q4, their collector terminals connected to the supply voltage Vcc and their base terminals connected to the voltage Vb.

Figure 4:
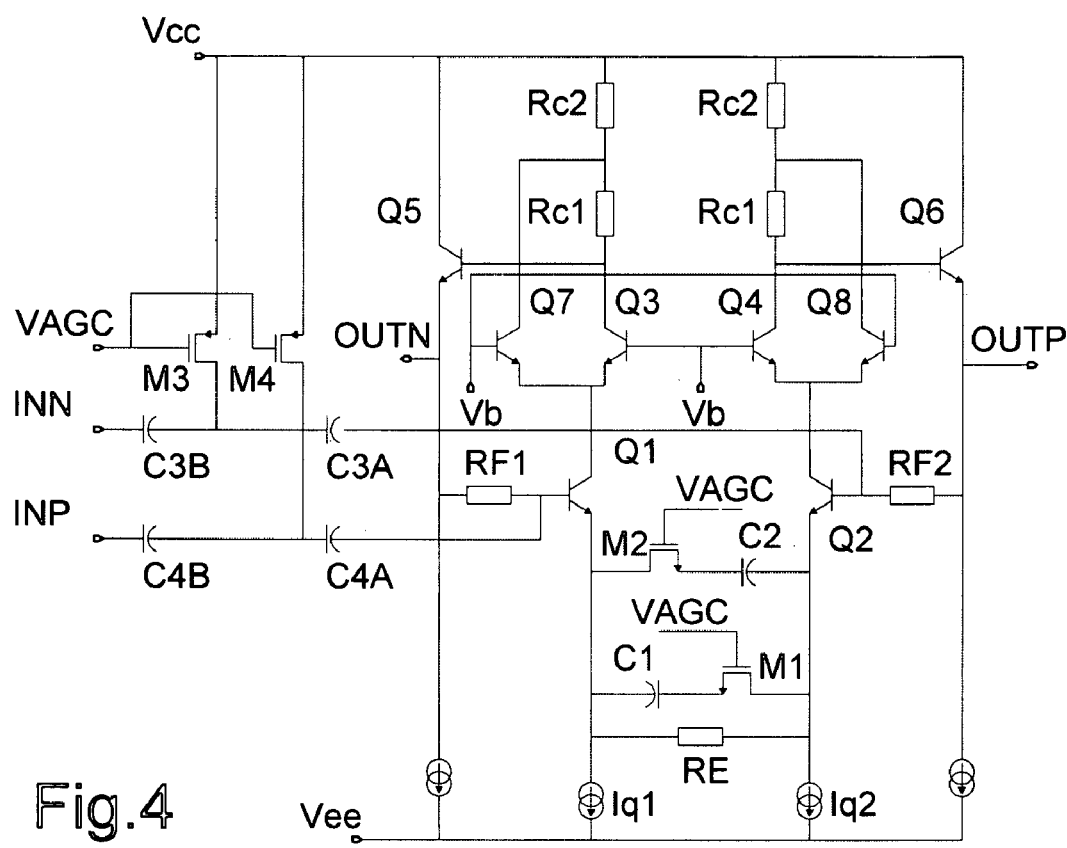
FIG. 4 is a circuit diagram of an implementation of a low noise amplifier according to another variant of the first embodiment of the present invention.

A further implementation of an amplifier according to another variant of the first embodiment of the present invention is shown in FIG. 4. The amplifier of FIG. 4 differs from the amplifier of FIG. 3 because the resistors Rc are constituted by two resistors Rc1 and Rc2 in series, and the collector terminals of the transistors Q7 and Q8 are connected to the common terminal of the resistors Rc1 and Rc2. In this manner, given that Rc=Rc1+Rc2, we have $A_{vmin}$=2*Rc2/Re.

Figure 5:
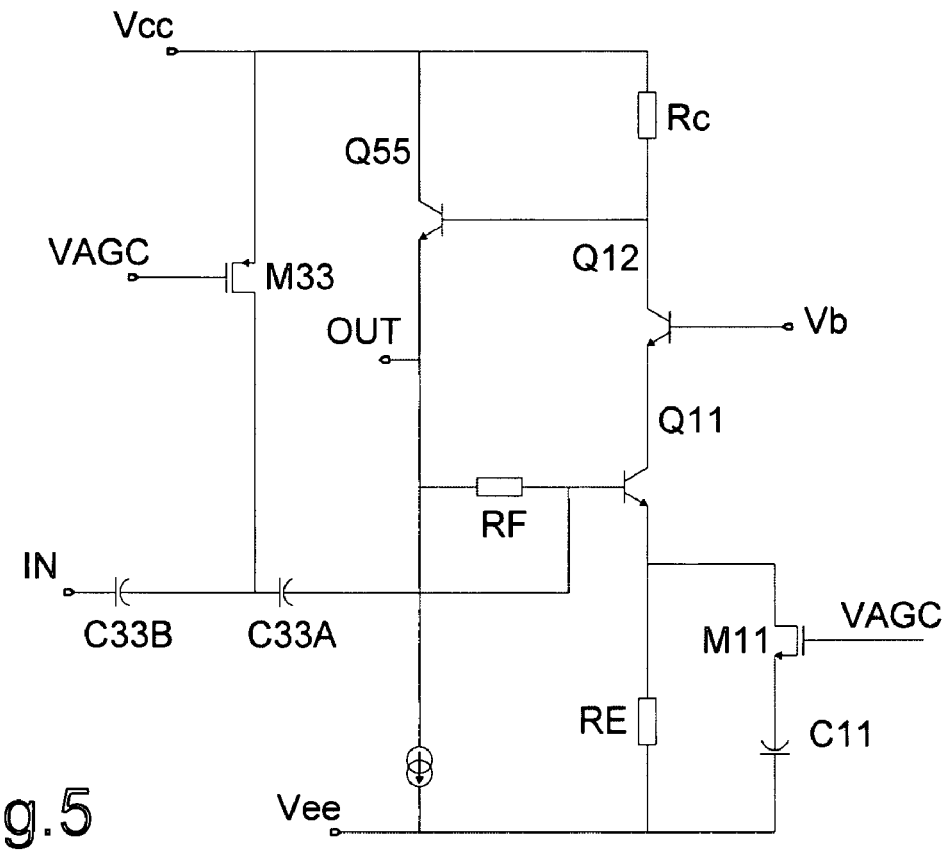
FIG. 5 is a circuit diagram of an implementation of a low noise amplifier in accordance with a second embodiment of the present invention.

An implementation of an amplifier according to a second embodiment of the present invention is shown in FIG. 5. The first circuit block 1 comprises a differential cascode apparatus formed by the bipolar npn transistors Q11 and Q12. The transistors Q11 and Q12 have their respective collector and emitter terminals in common, and the emitter terminal of the transistor Q11 is connected to the resistor RE that is connected in turn to the voltage Vee, while the collector terminal of the transistor Q12 is connected to a resistor Rc that is connected to the supply Vcc. The first circuit means 2 is made up of a series of an NMOS transistor M11 and a capacitor C11 placed between the emitter terminal of the transistor Q11 and the voltage Vee; the transistor M11 is controlled by the voltage VAGC. The transistor M11 is used to change the value of the degeneration resistance connected to the emitter terminal of the transistor Q11 by a value 0 (with VAGC=Vcc and M11 short-circuited) to a value RE (with VAGC=0 and M11 open). The capacitor C11 is used to keep the transistor M11 in the triode region in the conditions in which the voltage VAGC is between the values 0 and Vcc.

The amplifier also comprises a bipolar npn transistor Q55 whose base terminal is connected to the collector terminal of the transistor Q12, whose collector terminal is connected to the supply voltage Vcc and whose emitter terminal, that constitutes the output OUT of the amplifier, is connected to the base terminal of the transistor Q11 by a resistor RF and to a bias current generator.

The second circuit means 3 comprise a series of a PMOS transistor M33 and a capacitor C33A connected between the supply voltage Vcc and the base terminal of the transistor Q11; another capacitor C33B is placed between the input terminal IN of the amplifier and the drain terminal of the transistor M33. The transistor M33 is used to change the input impedance when the gain of the amplifier decreases, while the capacitors C33A and C33B are used for decoupling from the direct current and also to keep the transistor M33 in the triode region with the voltage Vds between the drain and source terminals equal to zero for all the values of voltage VAGC.

Figure 6:
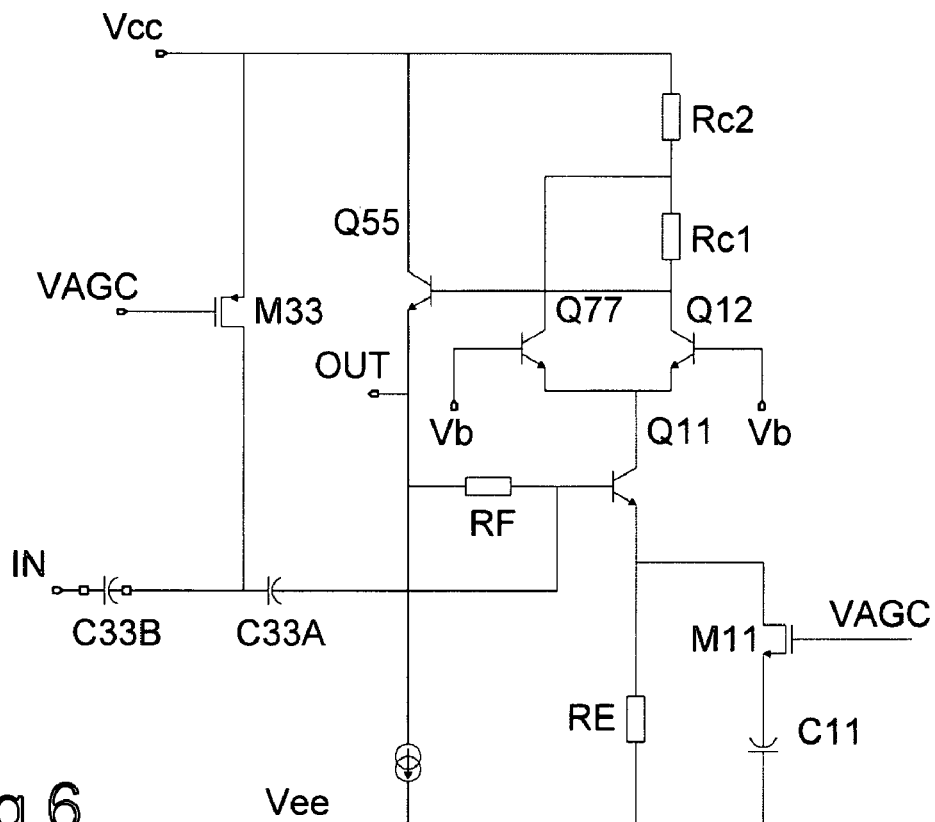
FIG. 6 is a circuit diagram of an implementation of a low noise amplifier in accordance with a variant of the second embodiment of the present invention.

A further implementation of the amplifier according to a variant of the second embodiment of the present invention is shown in FIG. 6. The amplifier of FIG. 6 differs from the amplifier of FIG. 5 because the resistor Rc is constituted by two resistors Rc1 and Rc2 in series, and because of the presence of a transistor Q77 whose collector terminal is connected to the common terminal of the resistors Rc1 and Rc2, whose base terminal is connected to the bias voltage Vb and whose emitter terminal is connected to the emitter terminal of the transistor Q12.

Figure 7:
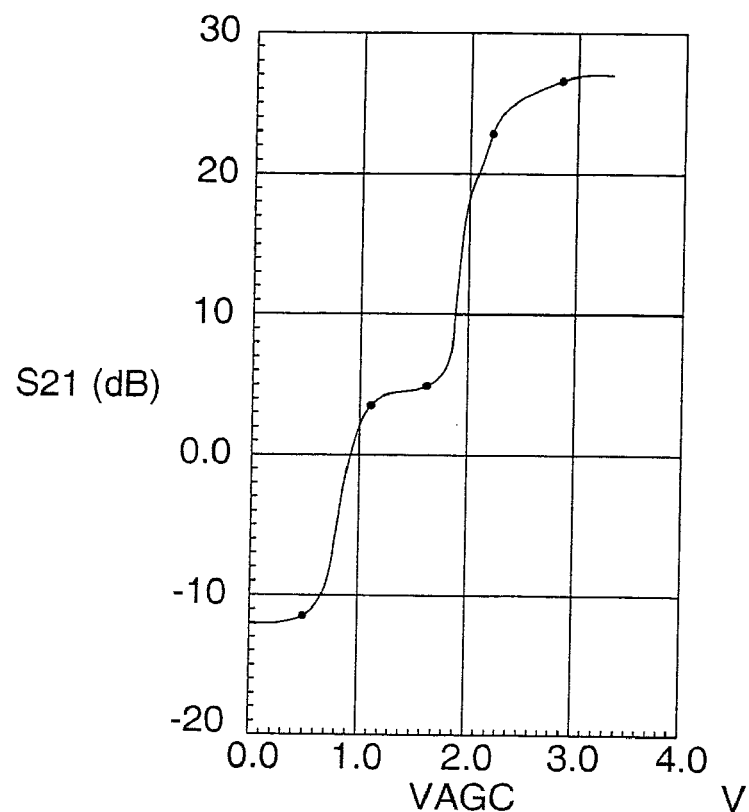
FIG. 7 is a graph of the trend of the voltage gain upon variation of the voltage VAGC.

From simulations carried out on the circuit of FIG. 4, considering the values $K_p$=2.35*10$^{-5}$, $V_{T,p}$=0.6V, (W/L)$_{3,4}$=130/0.35, and RF=1500 Ohm, a signal gain S21 between output and input is obtained that is variable from 26 dB to −12 dB for an interval of voltages VAGC variable from 3V to 0V, as seen in FIG. 7.

Figure 8:
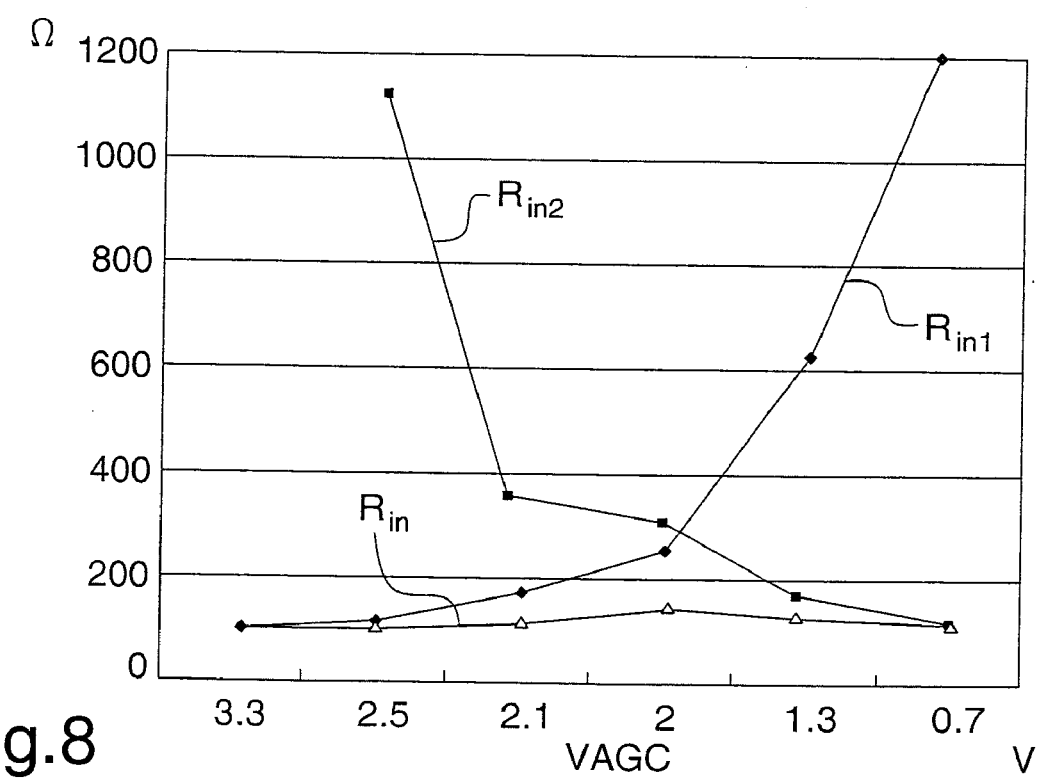
FIG. 8 is a graph of the trend of the resistances upon variation of the voltage VAGC.

FIG. 8 shows a graph of the resistances $R_{in1}$, $R_{in2}$ and $R_{in}$ upon variation of the voltage VAGC. As shown, the input resistor $R_{in}$ keeps substantially constant around a value of 100 Ohm.

Figure 9:
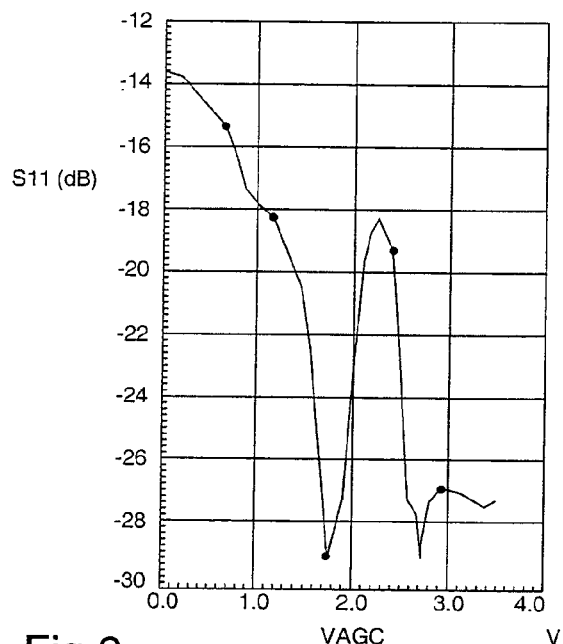
FIG. 9 is a graph of the trend of the return losses.

FIG. 9 shows a graph of the return losses S11 in decibel for a variation of the voltage VAGC from 0 to 3V. As shown, S11 varies from almost −14 dB to −29 dB.

Figure 10:
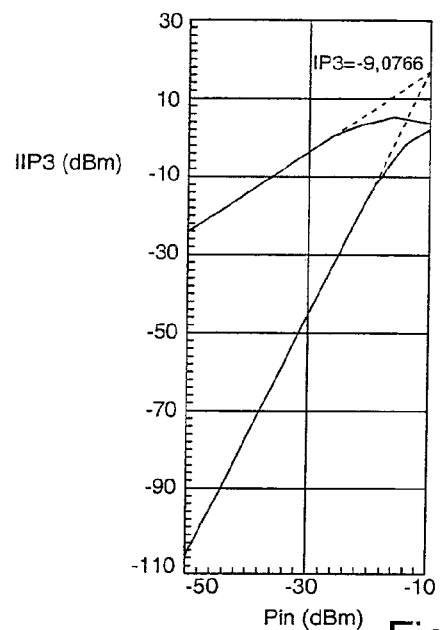
FIGS. 10 and 11 are graphs of the intercept and the noise pattern for the circuit of FIG. 4 in the case of maximum gain.

FIG. 10 shows a graph of the intercept of the third order IIP3, that is the third harmonic intercept referred to the input (Input Intercept Point 3), in dBm in function of the input power Pin in dBm in the case of maximum gain, VAGC=Vcc. The intercept point IP3=−9.0766.

Figure 11:
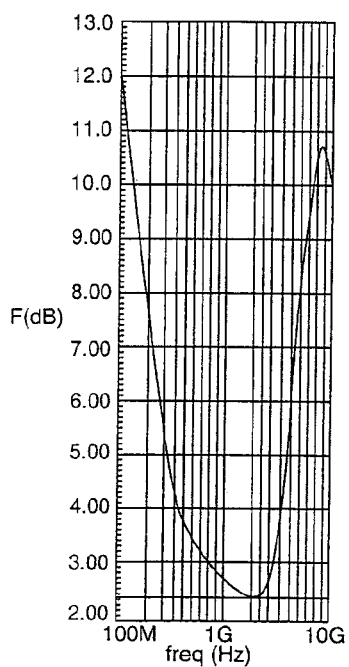

FIG. 11 shows a graph of the noise pattern F in decibel in function of the frequency freq in the case of maximum gain, VAGC=Vcc.

Figure 12:
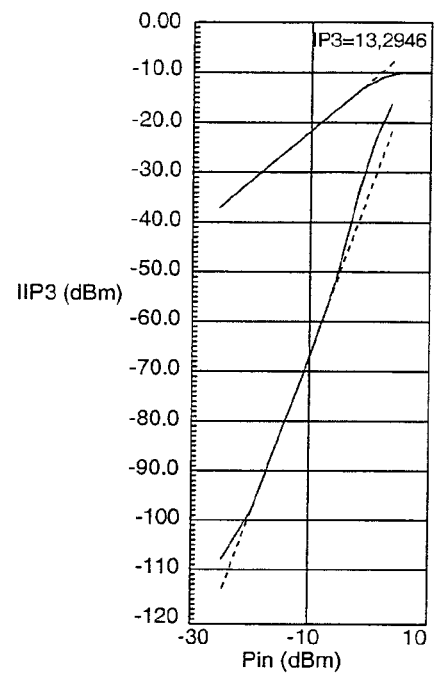
FIGS. 12 and 13 are graphs of the intercept and the noise pattern for the circuit of FIG. 4 in the case of minimum gain.
Figure 13:
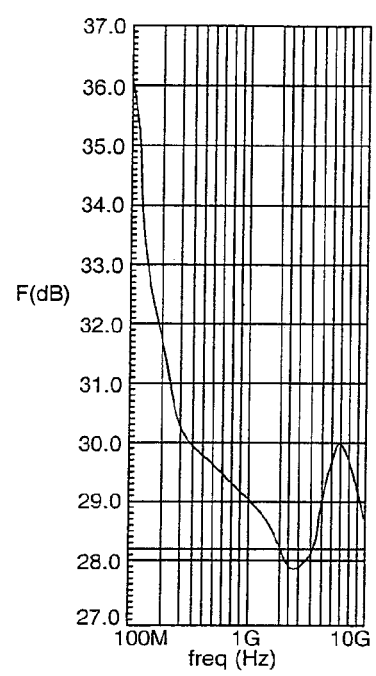

FIGS. 12 and 13 show graphs of the intercept of the third order IIP3 and the noise pattern F in the case of minimum gain, VAGC=0. As shown, IP3=13.2946.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A low noise amplifier comprising:
a first variable resistance;
at least a first circuit block capable of amplifying a first voltage signal that is input to the amplifier, the first circuit block having at least one first terminal coupled to a first supply voltage by the first variable resistance, at least one second terminal coupled to a second supply voltage by at least one resistor, and at least one further terminal that receives the first voltage signal;
at least one output terminal of the amplifier, the at least one second terminal being coupled to the at least one output terminal of the amplifier;
a feedback network coupled to the at least one output terminal of the amplifier and to the at least one further terminal of the first circuit block; and
a second circuit block coupled between the second supply voltage and the at least one further terminal of the first circuit block, the second circuit block being adapted to compensate for variations in value of the first variable resistance so as to ensure a substantially constant input resistance of the amplifier.

2. The amplifier according to claim 1, wherein the first variable resistance is controlled by a further voltage signal, and the second circuit block is also controlled by the further voltage signal.

3. The amplifier according to claim 2, wherein the first variable resistance comprises at least one resistor, and at least one transistor that has its non-drivable terminals connected to the terminals of the resistor, the at least one transistor being driven by the further voltage signal.

4. The amplifier according to claim 3, wherein the second circuit block comprises at least one transistor that is driven by the further voltage signal.

5. The amplifier according to claim 4, wherein the at least one transistor of the second circuit block is a PMOS transistor, and the at least one transistor of the first variable resistance is an NMOS transistor.

6. The amplifier according to claim 3, wherein the at least one transistor is a MOS transistor, and the first variable resistance further comprises at least one capacitor adapted to make the transistor operate in the triode region.

7. The amplifier according to claim 2, wherein the second circuit block comprises at least one transistor that is driven by the further voltage signal.

8. The amplifier according to claim 7, wherein the at least one transistor is a MOS transistor, and the second circuit block further comprises at least one capacitor adapted to make the transistor operate in the triode region.

9. The amplifier according to claim 1, wherein the feedback network comprises at least one resistor.

10. The amplifier according to claim 1, further comprising a buffer coupled between the at least one second terminal of the first circuit block and the at least one output terminal of the amplifier.

11. The amplifier according to claim 1,
wherein the first circuit block comprises first through fourth transistors in a differential cascode configuration, the first and second transistors being in one differential stage, and the third and fourth transistors connected to the first and second transistors to produce the cascode configuration,
the at least one first terminal of the first circuit block comprises two first terminals that correspond to one non-drivable terminal of the first transistor and one non-drivable terminal of the second transistor,
the at least one second terminal of the first circuit block comprises two second terminals that correspond to one non-drivable terminal of the third transistor and one non-drivable terminal of the fourth transistor,
the at least one further terminal of the first circuit block comprises two further terminals that correspond to the drivable terminal of the first transistor and the drivable terminal of the second transistor, and
the at least one output terminal of the amplifier comprises two output terminals.

12. The amplifier according to claim 11,
wherein the at least one resistor that couples the at least one second terminal to the second supply voltage comprises two series of resistors, each of the series of resistors including first and second resistors connected in series and to one of the second terminals of the first circuit block,
the amplifier further comprises two further transistors, a first of the further transistors having one non-drivable terminal connected to one non-drivable terminal of the third transistor, and a second of the further transistors having one non-drivable terminal connected to one non-drivable terminal of the fourth transistor, so as to produce two differential stages, and
another non-drivable terminal of the first further transistor being connected to the common terminal of the first and second resistors of one of the series of resistors, and another non-drivable terminal of the second further transistor being connected to the common terminal of the first and second resistors of another of the series of resistors.

13. The amplifier according to claim 1,
wherein the first circuit block comprises first and second transistors in a cascode configuration,
the at least one first terminal of the first circuit block comprises one non-drivable terminal of the first transistor,
the at least one second terminal of the first circuit block comprises one non-drivable terminal of the second transistor, and
the at least one further terminal of the first circuit block comprises a drivable terminal of the first transistor.

14. The amplifier according to claim 13,
wherein the at least one resistor that couples the at least one second terminal to the second supply voltage comprises a first resistor and a second resistor connected in series and to the one non-drivable terminal of the second transistor,
the amplifier further comprises a further transistor that has one non-drivable terminal connected to another non-drivable terminal of the second transistor to produce a differential stage, and
another non-drivable terminal of the further transistor is connected to the common terminal of the first and second resistors.

15. An apparatus for transmitting and receiving audio signals, the apparatus including at least one amplifier, the amplifier comprising:
a first variable resistance;
at least a first circuit block capable of amplifying a first voltage signal that is input to the amplifier, the first circuit block having at least one first terminal coupled to a first supply voltage by the first variable resistance, at least one second terminal coupled to a second supply voltage by at least one resistor, and at least one further terminal that receives the first voltage signal;
at least one output terminal of the amplifier, the at least one second terminal being coupled to the at least one output terminal of the amplifier;
a feedback network coupled to the at least one output terminal of the amplifier and to the at least one further terminal of the first circuit block; and
a second circuit block coupled between the second supply voltage and the at least one further terminal of the first circuit block, the second circuit block being adapted to compensate for variations in value of the first variable resistance so as to ensure a substantially constant input resistance of the amplifier.

16. The apparatus according to claim 15, wherein the first variable resistance of the amplifier is controlled by a further voltage signal, and the second circuit block of the amplifier is also controlled by the further voltage signal.

17. The apparatus according to claim 16, wherein the first variable resistance of the amplifier comprises at least one resistor, and at least one transistor that has its non-drivable terminals connected to the terminals of the resistor, the at least one transistor being driven by the further voltage signal.

18. The apparatus according to claim 16, wherein the second circuit block of the amplifier comprises at least one transistor that is driven by the further voltage signal.

19. The apparatus according to claim 15, wherein the amplifier further comprises a buffer coupled between the at least one second terminal of the first circuit block and the at least one output terminal of the amplifier.

20. The apparatus according to claim 15,
wherein the first circuit block of the amplifier comprises first through fourth transistors in a differential cascode configuration, the first and second transistors being in one differential stage, and the third and fourth transistors connected to the first and second transistors to produce the cascode configuration,
the at least one first terminal of the first circuit block comprises two first terminals that correspond to one non-drivable terminal of the first transistor and one non-drivable terminal of the second transistor,
the at least one second terminal of the first circuit block comprises two second terminals that correspond to one non-drivable terminal of the third transistor and one non-drivable terminal of the fourth transistor,
the at least one further terminal of the first circuit block comprises two further terminals that correspond to the drivable terminal of the first transistor and the drivable terminal of the second transistor, and
the at least one output terminal of the amplifier comprises two output terminals.

21. The apparatus according to claim 15,
wherein the first circuit block of the amplifier comprises first and second transistors in a cascode configuration,
the at least one first terminal of the first circuit block comprises one non-drivable terminal of the first transistor,
the at least one second terminal of the first circuit block comprises one non-drivable terminal of the second transistor, and
the at least one further terminal of the first circuit block comprises a drivable terminal of the first transistor.

* * * * *